United States Patent
Huang

(10) Patent No.: US 7,746,255 B1
(45) Date of Patent: Jun. 29, 2010

(54) A/D CONVERTER, METHOD FOR ADJUSTING ANALOG SIGNAL THEREIN, AND METHOD FOR CONVERTING ANALOG SIGNAL INTO DIGITAL SIGNAL

(75) Inventor: Chih-Haur Huang, Sinshih Township, Tainan County (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 19 days.

(21) Appl. No.: 12/368,564

(22) Filed: Feb. 10, 2009

(51) Int. Cl.
*H03M 1/00* (2006.01)
(52) U.S. Cl. ...................... 341/122; 341/155
(58) Field of Classification Search .......... 341/122–155
See application file for complete search history.

(56) References Cited

U.S. PATENT DOCUMENTS

| | | | |
|---|---|---|---|
| 3,981,005 A * | 9/1976 | Takayama et al. | 341/139 |
| 4,751,496 A * | 6/1988 | Araki et al. | 341/131 |
| 5,001,480 A * | 3/1991 | Ferry et al. | 341/108 |
| 6,304,205 B1 * | 10/2001 | Rezvani et al. | 341/161 |
| 6,567,031 B1 * | 5/2003 | Rezvani et al. | 341/161 |
| 6,825,783 B2 * | 11/2004 | You | 341/118 |
| 6,867,723 B1 * | 3/2005 | Tachibana et al. | 341/155 |
| 6,987,477 B1 * | 1/2006 | Aude | 341/161 |
| 7,233,276 B1 * | 6/2007 | Huang | 341/163 |
| 7,283,083 B1 * | 10/2007 | Kamal et al. | 341/161 |
| 7,372,389 B2 * | 5/2008 | Whittaker | 341/155 |
| 7,602,324 B1 * | 10/2009 | Huang et al. | 341/131 |
| 7,696,918 B2 * | 4/2010 | Kuramochi et al. | 341/161 |

* cited by examiner

*Primary Examiner*—Lam T Mai
(74) *Attorney, Agent, or Firm*—Thomas, Kayden, Horstemeyer & Risley

(57) ABSTRACT

An analog-to-digital converter includes a sample-and-hold amplifier (SHA), a plurality of stages of analog-to-digital converting (ADC) units and an adjustment circuit. The SHA samples an analog input signal. The ADC units serially converts the analog input signal sampled by the SHA into corresponding digital values, in which a first stage of the ADC units generates the digital value including most significant bits. The adjustment circuit controls the SHA by checking the most significant bits from the first stage of the ADC units to modify offsets of the analog input signal with respect to a reference value. A method for adjusting an analog input signal in an analog-to-digital converter and a method for converting an analog input signal into a digital signal are also disclosed herein.

20 Claims, 4 Drawing Sheets

US 7,746,255 B1

A/D CONVERTER, METHOD FOR ADJUSTING ANALOG SIGNAL THEREIN, AND METHOD FOR CONVERTING ANALOG SIGNAL INTO DIGITAL SIGNAL

BACKGROUND

1. Field of Invention

The present invention relates to an analog-to-digital converter. More particularly, the present invention relates to an analog-to-digital converter with a pipelined architecture.

2. Description of Related Art

Analog-to-digital converters (also called A/D converters or ADCs) are common construction blocks of electronic systems which process physical signals from transducers, electronic signal generating circuits, etc. In order to generate reliable digital signals by the A/D converter, not only circuits in the A/D converter should be well designed, but also the analog signals inputted into the A/D converter and transformed by the A/D converter have to be concerned. For example, if an analog signal with a large offset or an analog signal with a large swing is inputted into the A/D converter, the analog signal may be out of the operating range of the A/D converter. As a result, the A/D converter cannot perform well and convert the analog signal into the required digital signal.

SUMMARY

In accordance with one embodiment of the present invention, an analog-to-digital converter is provided. The analog-to-digital converter comprises a sample-and-hold amplifier (SHA), a plurality of stages of analog-to-digital converting (ADC) units and an adjustment circuit. The SHA samples an analog input signal. The ADC units serially converts the analog input signal sampled by the SHA into corresponding digital values, in which a first stage of the ADC units generates the digital value comprising most significant bits. The adjustment circuit controls the SHA by checking the most significant bits from the first stage of the ADC units to modify offsets of the analog input signal with respect to a reference value.

In accordance with another embodiment of the present invention, a method for adjusting an analog input signal in an analog-to-digital converter (ADC) is provided. The method comprising the steps of: sampling the analog input signal; generating a digital value comprising most significant bits corresponding to the sampled analog input signal; determining if amounts of bits 0 and 1 of the most significant bits being the same; and modifying offsets of the analog input signal with respect to a reference value when the amounts of bit 0 and 1 of the most significant bits being not the same.

In accordance with yet another embodiment of the present invention, a method for adjusting an analog input signal in an analog-to-digital converter (ADC) is provided, in which the ADC comprises a plurality of stages of ADC units. The method comprising the steps of: using a sample-and-hold amplifier (SHA) to sample the analog input signal; a first stage of the ADC units generating a digital value comprising most significant bits corresponding to the sampled analog input signal; determining if amounts of bits 0 and 1 of the most significant bits being the same; and controlling the SHA to modify offsets of the analog input signal with respect to a reference value when the amounts of bit 0 and 1 of the most significant bits being not the same.

In accordance with still yet another embodiment of the present invention, A method for converting an analog input signal into a digital signal by an analog-to-digital converter (ADC) is provided, in which the ADC comprises a plurality of stages of ADC units. The method comprising the steps of: generating digital values corresponding to the analog input signal, wherein one of the digital values comprising most significant bits; modifying offsets of the analog input signal with respect to a reference value according to the most significant bits; detecting if values of a residue signal, generated by one of the analog-to-digital converting units, being over an operating range of the analog-to-digital converting units; outputting a determining signal according to the over-range detection; adjusting an input gain for the analog input signal according to the determining signal; generating new digital values corresponding to the modified and adjusted analog input signal; and converting the new digital values into the digital signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
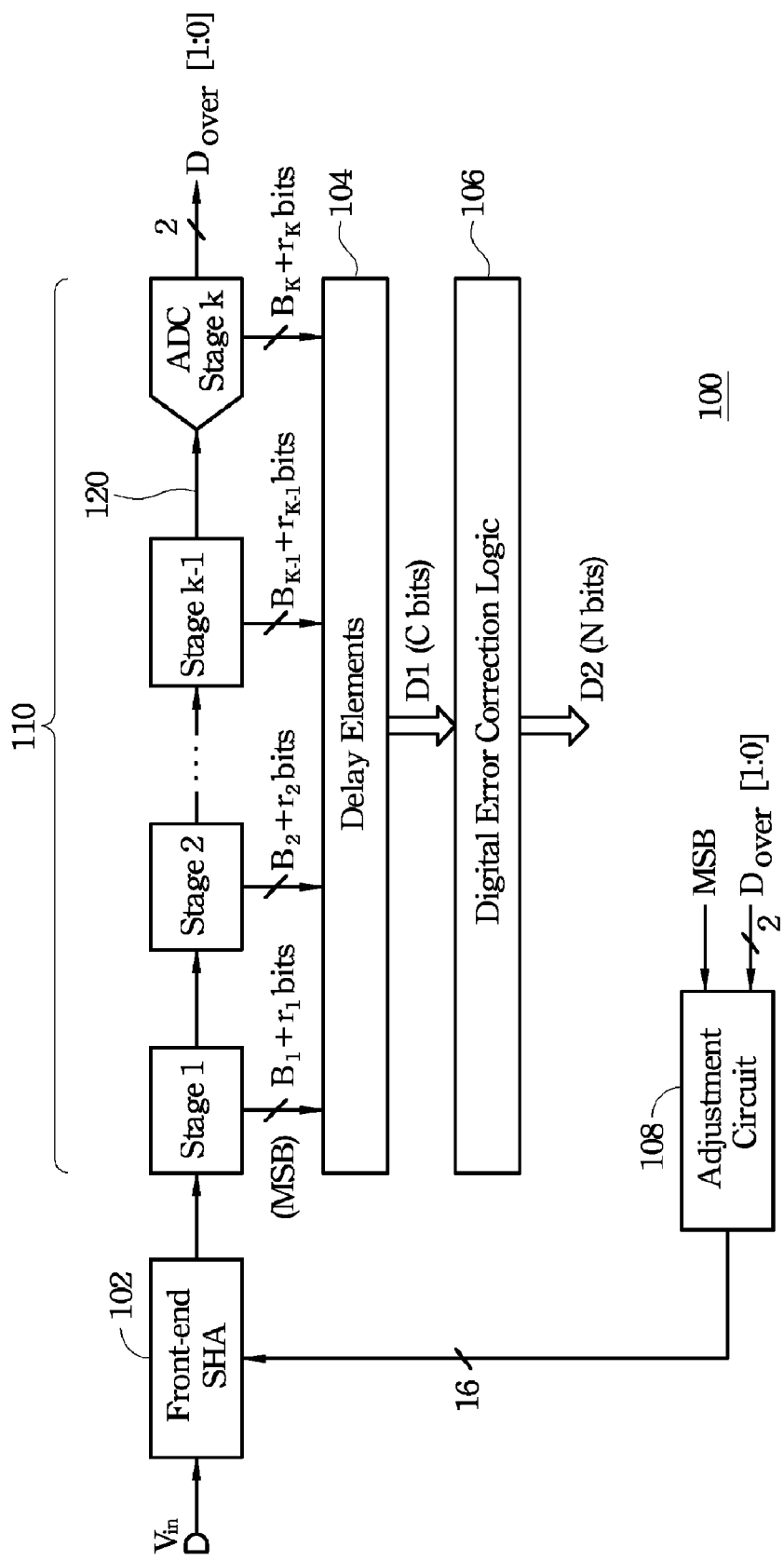
FIG. 1 illustrates a block diagram of a pipelined analog-to-digital converter (A/D converter) according to one embodiment of the present invention.

FIG. 1 illustrates a block diagram of a pipelined analog-to-digital converter (A/D converter) according to one embodiment of the present invention. The A/D converter 100 includes a front-end sample-and-hold amplifier (SHA) 102, a plurality of stages (e.g. K stages) of analog-to-digital converting (ADC) units 110, delay elements 104, a digital error correction logic 106 and an adjustment circuit 108. The SHA 102 receives and samples an analog input signal Vin and holds the sampled signal for the 1st stage of the ADC units 110. The ADC units 110 serially convert the analog input signal Vin sampled by the SHA 102 into corresponding digital values. Specifically, each stage of the ADC units 110 generates the digital value having a resolution of Bi+ri bits, where Bi represents the effective stage resolution and ri represents the redundancy for an offset correction. Each stage digitizes the residue of the previous stage, so the digital value $B_1$ outputted from the 1st stage of the ADC units 110 contains the most significant bits (MSBs) while the digital value $B_K$ outputted from the Kth stage of the ADC units 110 contains the least significant bits (LSBs). In addition, the ADC units 110 operate concurrently; that is, the 1st stage operates on the most recent sample from the SHA 102 while all other stages operate on residues from previous samples.

The delay elements 104 synchronize the digital outputs from the ADC units 110 and generate a digital output D1 with C bits. The digital error correction logic 106 corrects errors or offsets in the digital output D1 and thus generates a digital signal D2 with N bits. The adjustment circuit 108 checks the MSBs from the 1st stage of the ADC units 110 and thus controls the SHA 102 to modify offsets of the analog input signal Vin with respect to a reference value (e.g. common-mode voltage value) or an average value of the analog input signal Vin. For example, the MSBs from the 1st stage of the ADC units 110 have different amounts of bit 0 and 1, and it is thus known that the analog input signal Vin has an offset with respect to the reference value or the average value of the analog input signal Vin. At the moment, the adjustment circuit 108 checks the MSBs and then controls the SHA 102 to modify the offset of the analog input signal Vin, such that the offset of the analog input signal Vin is adjusted and then the 1st stage of the ADC units 110 can thus generate the MSBs having same amount (hereinafter meaning approximately or exactly same amount) of bit 0 and 1.

In addition, a final stage, i.e. Kth stage, of the ADC units 110 can further receive a residue signal 120 from a previous stage, i.e. (K−1)th stage, of the ADC units 110 and detect if values of the residue signal 120 is over an operating range of the Kth stage of the ADC units 110, thus outputting a determining signal Dover[1:0]. After that, the adjustment circuit 108 controls the SHA 102 according to the determining signal Dover[1:0] to modify an input gain for the analog input signal Vin, such that the swing of the analog input signal Vin transmitted from the SHA 102 to the ADC units 110 is not in an over-range case, and the ADC units 110 can normally convert the signal Vin having values within the operating range of each of the ADC units 110.

Figure 2:
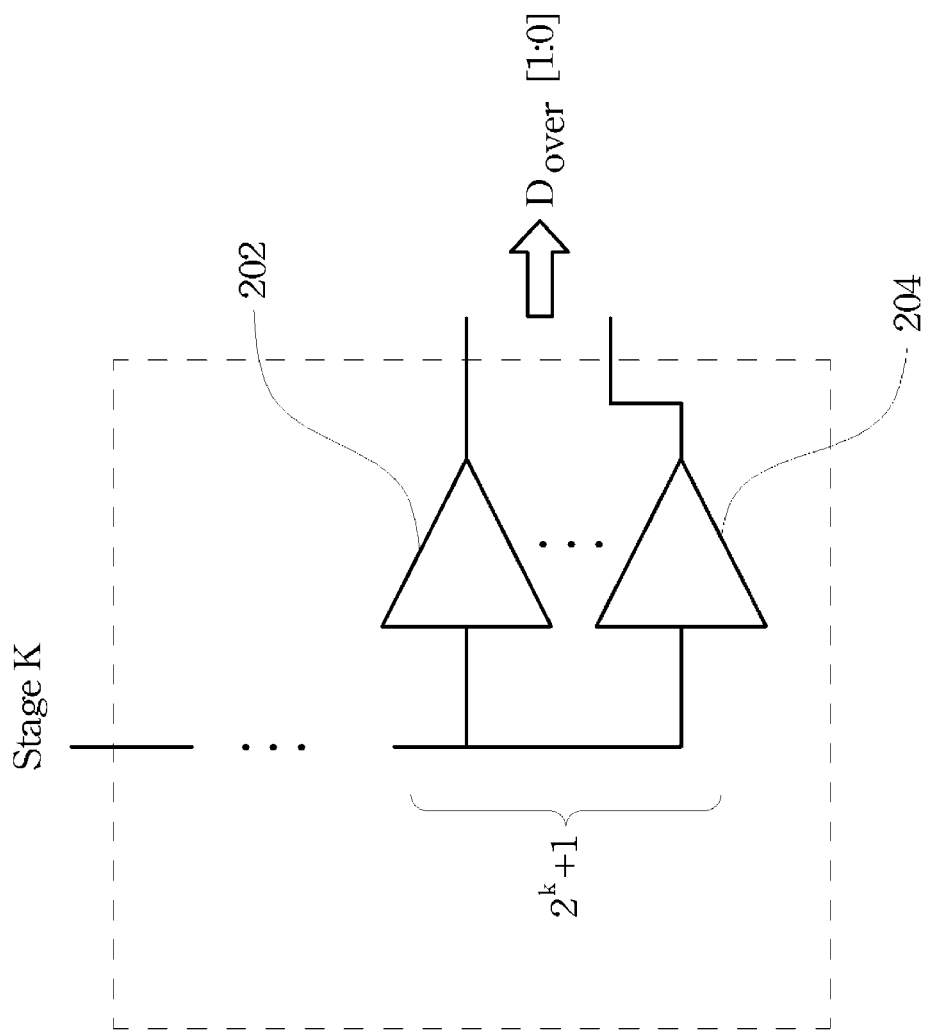
FIG. 2 illustrates a general block diagram of the Kth stage of the ADC units shown in FIG. 1 according to one embodiment of the present invention.

Furthermore, the Kth stage of the ADC units 110 can include $2^k+1$ comparators, where K is the amount of the ADC units 110, in which one of the $2^k+1$ comparators is provided for comparing a highest value of the residue signal 120 with a first threshold of the operating range of the Kth stage of the ADC units 110, and another of the $2^k+1$ comparators is provided for comparing a lowest value of the residue signal 120 with a second threshold of the operating range of the Kth stage of the ADC units 110. FIG. 2 illustrates a general block diagram of the Kth stage of the ADC units shown in FIG. 1 according to one embodiment of the present invention. As shown in FIG. 2, the Kth stage of the ADC units includes $2^k+1$ comparators, in which the first comparator 202 compares the highest value of the residue signal with a high threshold of the operating range of the Kth stage, and the last comparator 204 compares the lowest value of the residue signal with a low threshold of the operating range of the Kth stage, accordingly generating the determining signal Dover[1:0] to be transmitted to the adjustment circuit 108.

Figure 3:
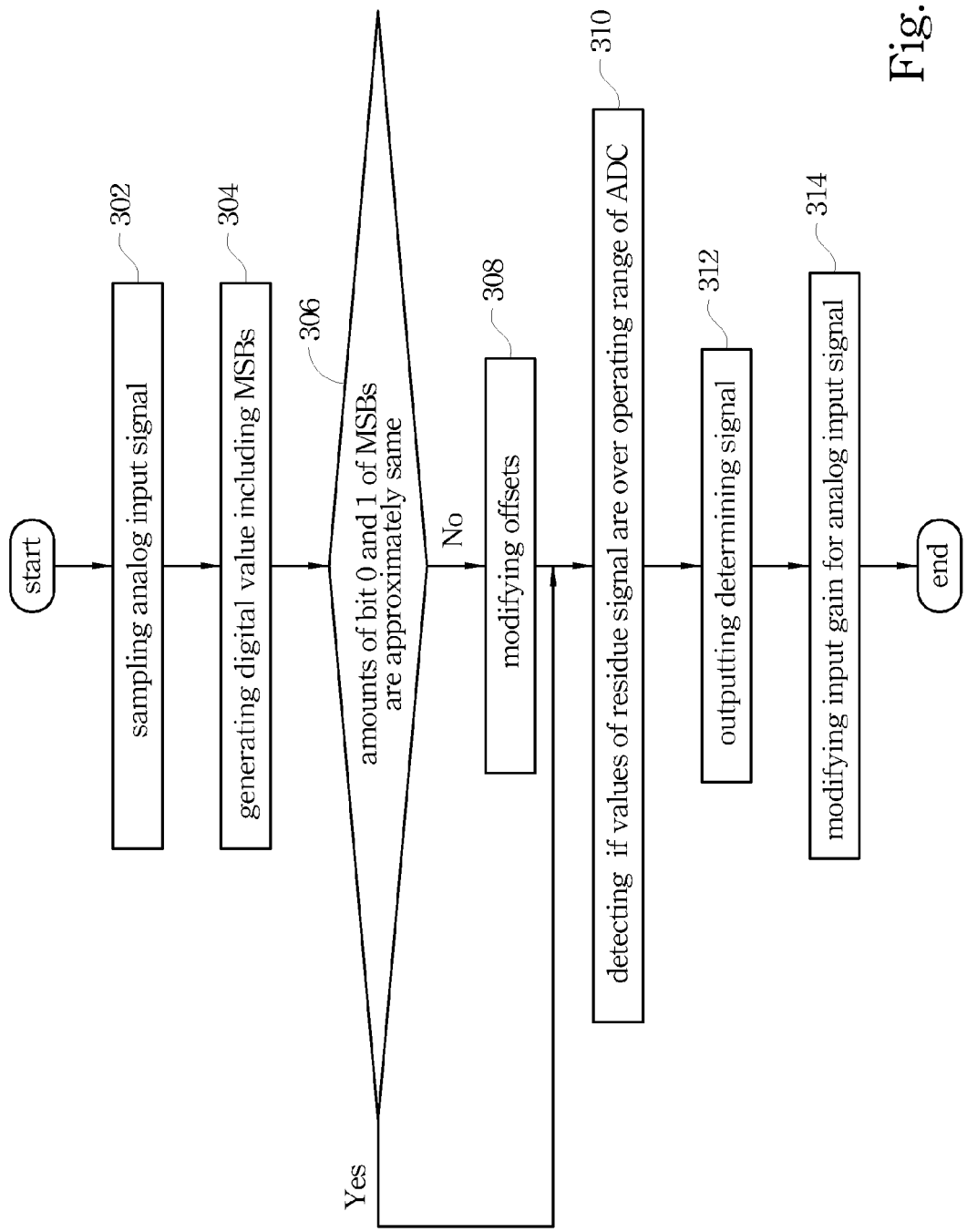
FIG. 3 illustrates a flow chart of a method for adjusting an analog input signal in an analog-to-digital converter (ADC) according to one embodiment of the present invention.

FIG. 3 illustrates a flow chart of a method for adjusting an analog input signal in an analog-to-digital converter (ADC) according to one embodiment of the present invention. Refer to FIGS. 1 and 3. First, the analog input signal Vin is sampled by the SHA 102 (Step 302). Then, a digital value including most significant bits (MSBs) corresponding to the sampled analog input signal Vin is generated by the 1st stage of the ADC units 110 (Step 304). After that, whether or not the amounts of bit 0 and 1 of the MSBs of the digital value are the same is determined (Step 306). When the amounts of bit 0 and 1 of the MSBs are not the same, offsets of the analog input signal Vin with respect to the reference value or the average value of the analog input signal Vin are modified by controlling the SHA 102 (Step 308), thus generating the MSBs having same amount of bit 0 and 1. On the other hand, when the MSBs have same amount of bit 0 and 1, Step 308 may be saved.

When the offsets of the analog input signal Vin with respect to the reference value or the average value of the analog input signal Vin are modified or the MSBs have same amount of bit 0 and 1, whether or not values of a residue signal generated in the ADC are over an operating range of the ADC is detected (Step 310). Then, the determining signal Dover[1:0] is outputted according to the over-range detection (Step 312). In the present embodiment, the Kth stage of the ADC units 110 detects whether or not the values of the residue signal from the (K−1)th stage of the ADC units 110 are over the operating range of the Kth stage of the ADC units 110, and then the Kth stage of the ADC units 110 outputs the determining signal Dover[1:0] according to the over-range detection. In one embodiment, a highest value of the residue signal can be compared with a high threshold of the operating range, a lowest value of the residue signal can be compared with a low threshold of the operating range, and then the determining signal Dover[1:0] is thus generated according to the comparisons.

When one of the values of the residue signal generated in the ADC is over the operating range of the ADC, an input gain for the analog input signal Vin is modified according to the determining signal Dover[1:0] by controlling the SHA 102 (Step 314), such that the swing of the analog input signal Vin can be prevented from the over-range case. On the other hand, when the values of the residue signal are not over the operating range of the ADC, Step 314 may be saved.

Figure 4:
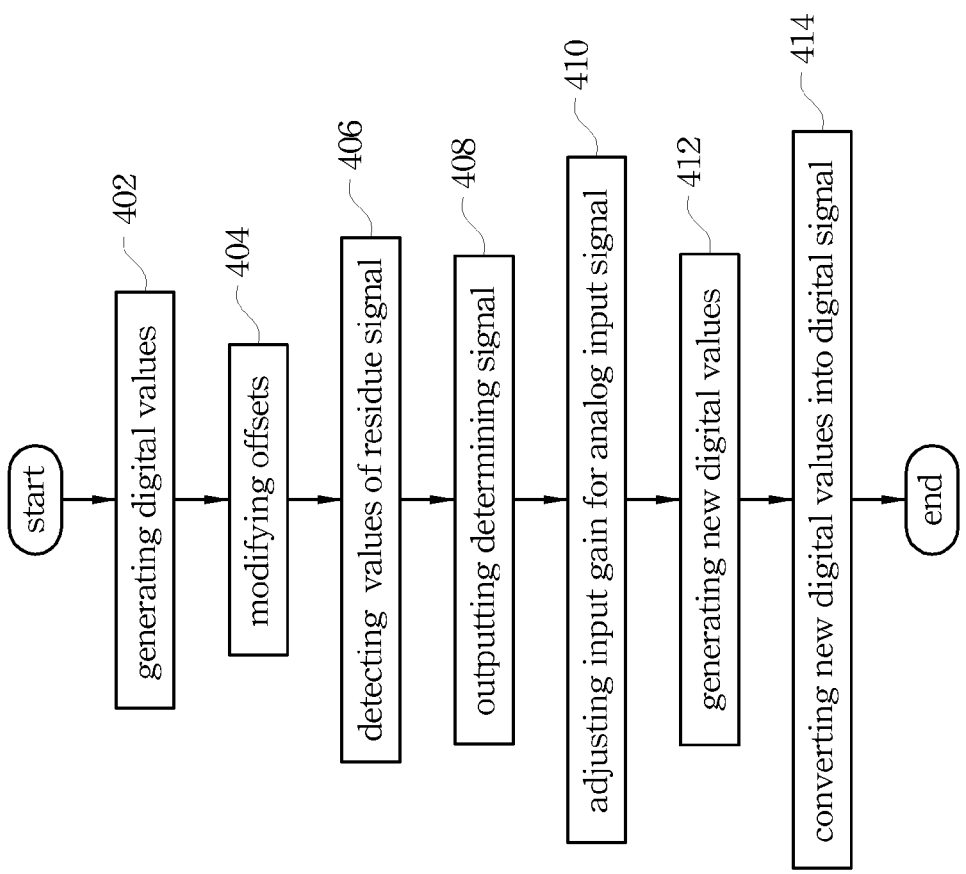
FIG. 4 illustrates a flow chart of a method for converting an analog input signal into a digital signal according to one embodiment of the present invention.

FIG. 4 illustrates a flow chart of a method for converting an analog input signal into a digital signal according to one embodiment of the present invention. Refer to FIGS. 1 and 4. First, the digital values corresponding to the analog input signal Vin are generated by the ADC units 110 (Step 402), in which the digital value $B_1$ outputted from the 1st stage of the ADC units 110 includes the MSBs. Then, offsets of the analog input signal Vin with respect to the reference value or the average value of the analog input signal Vin are modified according to the MSBs (Step 404). After that, whether or not the values of the residue signal, generated by the (K−1)th stage of the ADC units 110, are over the operating range of the Kth stage of the ADC units 110 is detected (Step 406). Afterwards, the determining signal Dover[1:0] is outputted according to the over-range detection (Step 408). In Step 406, a highest value of the residue signal can be compared with a high threshold of the operating range, a lowest value of the residue signal can be compared with a low threshold of the operating range, and then the determining signal Dover[1:0] is thus generated according to the comparisons.

Then, an input gain for the analog input signal Vin is adjusted according to the determining signal Dover[1:0] (Step 410). Next, the modified and adjusted analog input signal Vin are re-transmitted into the ADC units 110 and new digital values corresponding to the modified and adjusted analog input signal Vin are thus generated (Step 412) by the ADC units 110. After that, the new digital values (i.e. new Bi+ri bits) are transformed into the digital signal D2 (Step 414). In the present embodiment, the new digital values are first synchronized by the delay elements 104 and then the errors in the new digital values are corrected by the digital error correction logic 106, thus generating the digital signal D2.

For the foregoing embodiments, the A/D converter, the method for adjusting the analog input signal in the analog-to-digital converter, and the method for converting the analog input signal into the digital signal can be employed to modify the analog input signal being converted, such that the analog input signal with a large offset or swing can be modified and maintained within the operating range of the A/D converter, thus generating and improving the required digital signal.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An analog-to-digital converter, comprising:
a sample-and-hold amplifier (SHA) for sampling an analog input signal;
a plurality of stages of analog-to-digital converting (ADC) units for serially converting the analog input signal sampled by the SHA into corresponding digital values, a first stage of the ADC units generating the digital value comprising most significant bits; and
an adjustment circuit controlling the SHA by checking the most significant bits from the first stage of the ADC units to modify offsets of the analog input signal with respect to a reference value.

2. The analog-to-digital converter as claimed in claim 1, wherein the first stage of the ADC units generates the most significant bits which have same amount of bit 0 and 1 after the offsets of the analog input signal with respect to the reference value are modified.

3. The analog-to-digital converter as claimed in claim 1, wherein a final stage of the ADC units outputting a determining signal by receiving a residue signal from a previous stage of the ADC units and detecting if values of the residue signal being over an operating range of the final stage of the ADC units.

4. The analog-to-digital converter as claimed in claim 3, wherein the adjustment circuit controls the SHA according to the determining signal to modify an input gain for the analog input signal.

5. The analog-to-digital converter as claimed in claim 4, wherein the ADC units serially convert the analog input signal having values within the operating range of each of the ADC units after the input gain for the analog input signal is modified.

6. The analog-to-digital converter as claimed in claim 3, wherein the final stage of the ADC units further comprising $2^k+1$ comparators, where K is an amount of the ADC units.

7. The analog-to-digital converter as claimed in claim 6, wherein one of the comparators compares a highest value of the residue signal with a first threshold of the operating range of the final stage of the ADC units and another of the comparators compares a lowest value of the residue signal with a second threshold of the operating range of the final stage of the ADC units.

8. A method for adjusting an analog input signal in an analog-to-digital converter (ADC), the method comprising the steps of:
sampling the analog input signal;
generating a digital value comprising most significant bits corresponding to the sampled analog input signal;
determining if amounts of bits 0 and 1 of the most significant bits being the same; and
modifying offsets of the analog input signal with respect to a reference value when the amounts of bit 0 and 1 of the most significant bits being not the same.

9. The method as claimed in claim 8, further comprising:
detecting if values of a residue signal generated in the ADC being over an operating range of the ADC after the offsets of the analog input signal with respect to the reference value being modified.

10. The method as claimed in claim 9, further comprising:
outputting a determining signal according to the over-range detection.

11. The method as claimed in claim 10, further comprising:
modifying an input gain for the analog input signal according to the determining signal when one of the values of the residue signal generated in the ADC being over the operating range of the ADC.

12. The method as claimed in claim 9, wherein the detecting step further comprises:
comparing a highest value of the residue signal with a first threshold of the operating range;
comparing a lowest value of the residue signal with a second threshold of the operating range; and
outputting a determining signal according to the comparisons.

13. A method for adjusting an analog input signal in an analog-to-digital converter (ADC), the ADC comprising a plurality of stages of ADC units, the method comprising the steps of:
using a sample-and-hold amplifier (SHA) to sample the analog input signal;
a first stage of the ADC units generating a digital value comprising most significant bits corresponding to the sampled analog input signal;
determining if amounts of bits 0 and 1 of the most significant bits being the same; and
controlling the SHA to modify offsets of the analog input signal with respect to a reference value when the amounts of bit 0 and 1 of the most significant bits being not the same.

14. The method as claimed in claim 13, further comprising:
when the amounts of bit 0 and 1 of the most significant bits being the same, a final stage of the ADC units detecting if values of a residue signal from a previous stage of the ADC units being over an operating range of the final stage of the ADC units.

15. The method as claimed in claim 14, further comprising:
the final stage of the ADC units outputting a determining signal according to the over-range detection.

16. The method as claimed in claim 15, further comprising:
controlling the SHA to modify an input gain for the analog input signal according to the determining signal when one of the values of the residue signal being over the operating range of the final stage of the ADC units.

17. The method as claimed in claim 14, wherein the detecting step further comprises:
using a first comparator in the final stage of the ADC units to compare a highest value of the residue signal with a first threshold of the operating range;
using a second comparator in the final stage of the ADC units to compare a lowest value of the residue signal with a second threshold of the operating range; and
the final stage of the ADC units outputting a determining signal according to the comparisons.

18. A method for converting an analog input signal into a digital signal by an analog-to-digital converter (ADC), the ADC comprising a plurality of stages of analog-to-digital converting units, the method comprising the steps of:

generating digital values corresponding to the analog input signal, wherein one of the digital values comprising most significant bits;

modifying offsets of the analog input signal with respect to a reference value according to the most significant bits;

detecting if values of a residue signal, generated by one of the analog-to-digital converting units, being over an operating range of the analog-to-digital converting units;

outputting a determining signal according to the over-range detection;

adjusting an input gain for the analog input signal according to the determining signal;

generating new digital values corresponding to the modified and adjusted analog input signal; and converting the new digital values into the digital signal.

19. The method as claimed in claim 18, wherein the detecting step further comprises:

comparing a highest value of the residue signal with a first threshold of the operating range; and comparing a lowest value of the residue signal with a second threshold of the operating range.

20. The method as claimed in claim 18, wherein the converting step further comprises:

correcting errors in the new digital values to generate the digital signal.

* * * * *